United States Patent
Xu et al.

(10) Patent No.: US 10,797,736 B2
(45) Date of Patent: Oct. 6, 2020

(54) RADIO-FREQUENCY POWER AMPLIFICATION CIRCUIT AND RADIO-FREQUENCY MODE ADJUSTMENT METHOD

(71) Applicant: SMARTER MICROELECTRONICS (GUANG ZHOU) CO., LTD., Guangzhou (CN)

(72) Inventors: Baiming Xu, Guangzhou (CN); Qiang Su, Guangzhou (CN); Yang Li, Guangzhou (CN); Jiangtao Yi, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 0 days.

(21) Appl. No.: 16/666,598

(22) Filed: Oct. 29, 2019

(65) Prior Publication Data
US 2020/0067540 A1  Feb. 27, 2020

Related U.S. Application Data

(63) Continuation of application No. PCT/CN2017/108448, filed on Oct. 30, 2017.

(30) Foreign Application Priority Data

Oct. 16, 2017  (CN) .......................... 2017 1 0958310

(51) Int. Cl.
*H04B 1/04* (2006.01)
*H03F 1/00* (2006.01)
(Continued)

(52) U.S. Cl.
CPC ........... *H04B 1/0067* (2013.01); *H03F 1/565* (2013.01); *H03F 3/245* (2013.01); *H04B 1/0483* (2013.01);
(Continued)

(58) Field of Classification Search
CPC .... H03F 1/0211; H03F 1/0222; H03F 1/0277; H03F 3/189; H03F 3/2178;
(Continued)

(56) References Cited

U.S. PATENT DOCUMENTS 8,599,963 B2* 12/2013 Chan ..................... H04W 52/52
                                                              375/297
9,099,961 B2* 8/2015 Kay ....................... H03F 1/0244
(Continued)

*Primary Examiner* — Quochien B Vuong
(74) *Attorney, Agent, or Firm* — Syncoda LLC; Feng Ma

(57) ABSTRACT

A radio-frequency power amplification circuit includes: a power amplification sub-circuit and an output matching sub-circuit, wherein the power amplification sub-circuit is used for selecting, according to a received control signal corresponding to a radio-frequency mode, a power amplification parameter corresponding to the radio-frequency mode to amplify a received radio-frequency signal, and outputting the amplified radio-frequency signal; the output matching sub-circuit is connected to the power amplification sub-circuit and is used for receiving the amplified radio-frequency signal, and transmitting, according to the control signal, the amplified radio-frequency signal by using an impedance corresponding to the radio-frequency mode.

10 Claims, 5 Drawing Sheets

(51) Int. Cl.
*H03F 3/20* (2006.01)
*H04B 1/00* (2006.01)
*H03F 1/56* (2006.01)
*H03F 3/24* (2006.01)

(52) U.S. Cl.
CPC .. *H03F 2200/387* (2013.01); *H03F 2200/451* (2013.01); *H04B 2001/0408* (2013.01)

(58) Field of Classification Search
CPC ............ H03F 2200/18; H03F 2200/39; H03F 2200/111; H03F 2200/171; H03F 2200/378; H03F 2200/421; H03F 2200/429; H03F 2200/451; H04B 1/04; H04B 1/006; H04B 1/16; H04B 1/40; H04B 1/401; H04B 2001/0408; H04W 52/52; H04W 88/06; H04M 1/0202
See application file for complete search history.

(56) References Cited

U.S. PATENT DOCUMENTS

| | | | |
|---|---|---|---|
| 9,755,578 B2* | 9/2017 | Shi | H03F 3/195 |
| 9,935,585 B2* | 4/2018 | Shirvani | H03F 1/0211 |
| 10,211,861 B2* | 2/2019 | Vaillancourt | H03F 3/195 |

* cited by examiner

US 10,797,736 B2

RADIO-FREQUENCY POWER AMPLIFICATION CIRCUIT AND RADIO-FREQUENCY MODE ADJUSTMENT METHOD

CROSS-REFERENCE TO RELATED APPLICATIONS

The present application is a continuation of, and claims priority to, PCT/CN2017/108448 filed on Oct. 30, 2017, which in turn claims priority to Chinese Patent Application No. 201710958310.8 filed on Oct. 16, 2017. The disclosures of these applications are hereby incorporated by reference in their entirety.

BACKGROUND

With the development of a communication technology, a mobile communication system has gradually evolved into a communication method capable of supporting multiple network modes and multiple network frequency bands from a communication method for supporting only one network mode. This communication method for supporting multiple network frequency bands and multiple network modes may be referred to as multi-frequency multi-mode communication.

SUMMARY

The disclosure relates to a power amplifying technology in the technical field of electronics, and in particular to a radio-frequency power amplification circuit and a radio-frequency mode adjustment method.

In view of this, the embodiment of the disclosure is directed to a circuit for radio frequency power amplifying and a method for adjusting a radio frequency mode, which are intended to solve the problem of large difficulty in making a multi-mode terminal light and thin due to a large volume of a circuit board.

The technical solution of the embodiment of the disclosure is implemented as follows.

The embodiment of the disclosure provides a circuit for radio frequency power amplifying, which includes a power amplifying sub-circuit and an output matching sub-circuit.

The power amplifying sub-circuit is configured to select, according to a received control signal corresponding to a radio frequency mode, a power amplifying parameter corresponding to the radio frequency mode, amplify a received radio frequency signal, and output the amplified radio frequency signal.

The output matching sub-circuit is connected to the power amplifying sub-circuit and configured to receive the amplified radio frequency signal and transmit the amplified radio frequency signal by using impedance corresponding to the radio frequency mode according to the control signal.

The embodiment of the disclosure also provides a method for adjusting a radio frequency mode, which includes the following operations.

A radio frequency mode currently used by a communication device is determined;

a control signal is generated according to correspondences between the radio frequency mode and the control signal;

the control signal is inputted into a power amplifying sub-circuit and an output matching sub-circuit in an electronic device;

the power amplifying sub-circuit selects a power amplifying parameter according to the control signal and amplifies a received radio frequency signal; and the output matching sub-circuit transmits the amplified radio frequency signal by using impedance corresponding to the radio frequency mode according to the control signal.

In the embodiment of the disclosure, a circuit for radio frequency power amplifying and a method for adjusting a radio frequency mode are provided. The circuit for radio frequency power amplifying includes a power amplifying sub-circuit and an output matching sub-circuit. The power amplifying sub-circuit receives a control signal, enters a radio frequency mode corresponding to the control signal, selects a power amplifying parameter corresponding to the radio frequency mode and amplifies a received radio frequency mode. The output matching sub-circuit transmits the amplified radio frequency signal by using appropriate impedance. In this case, the circuit for radio frequency power amplifying can amplify radio frequency signals in different radio frequency modes in multiple communication modes. Compared with a multi-mode terminal using multiple independent circuits for radio frequency power amplifying to amplify radio frequency signals in different radio frequency modes, it has the following characteristics.

On the one hand, the number of circuits for radio frequency power amplifying is reduced, thereby reducing the area of a printed circuit board occupied by the circuit for radio frequency power amplifying, reducing a volume occupied by the printed circuit board in the device, solving the problem of a large volume of the multi-mode terminal relative to a single-mode terminal, and reducing the difficulty of implementing thin and light the multi-mode terminals On the other hand, a circuit for radio frequency power amplifying can be used for amplifying radio frequency signals in multiple radio frequency modes. Therefore, compared with multiple independent circuits for radio frequency power amplifying, while the chip integration can be improved, the number of used electronic elements can be reduced, thereby reducing the hardware cost consumed by the electronic components.

DETAILED DESCRIPTION

A printed circuit board of a multi-mode terminal may occupy a large volume in the terminal, which makes the multi-mode terminal difficult to be light and thin.

Figure 1:
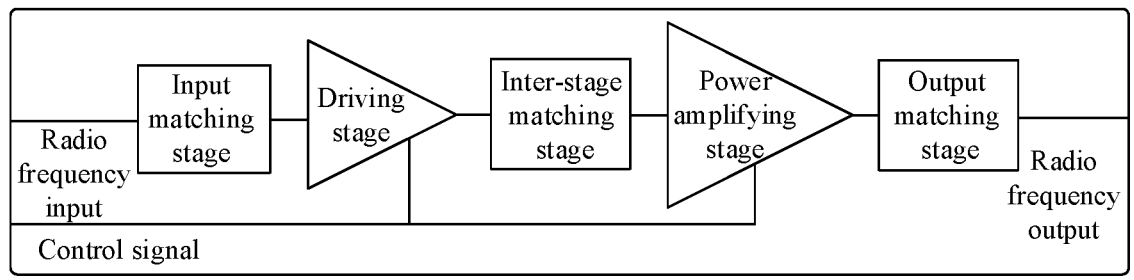
FIG. 1 is a schematic diagram of a basic structure of a circuit for radio frequency power amplifying.

A basic structure of a circuit for radio frequency power amplifying capable of supporting multi-frequency multi-mode is illustrated in FIG. 1. The circuit mainly includes an input matching stage, a driving stage, an inter-stage matching stage, a power amplifying stage and an output matching stage. The circuit for radio frequency power amplifying mainly performs power amplification on a received radio frequency signal by the power amplifying stage.

In a multi-frequency multi-mode communication technology solution, a 2nd-generation (2G) mobile communication network may be a global system for mobile communication (GSM), an enhanced data rate for GSM evolution (EDGE) and other 2G mobile communication networks. A 3rd-generation (3G)/4th-generation (4G) mobile communication network may be a wideband code division multiple access (WCDMA), a time division-synchronous code division multiple access (TDSCDMA), a long term evolution (LTE) and other communication networks. For radio frequency power amplifier in the above network mode, it is required to use a circuit for radio frequency power amplifying having the structure illustrated in FIG. 1.

A power amplifier supporting a 2G network mode requires relatively high saturation power compared to a power amplifier supporting a 3G/4G network mode, and the power amplifier supporting the 2G network mode can avoid the problems such as burning and oscillation in the event of load mismatch. This requires the power amplifier supporting the 2G network mode to have a power amplifying stage having a relatively large chip area and relatively low load impedance compared to the power amplifier supporting the 3G/4G network mode. For the power amplifier supporting the 3G/4G network mode, relatively high linear power and relatively low operating current are required compared to the power amplifier supporting the 2G network mode. Since a filter is connected in the 3G/4G network mode, a degree of load mismatch is reduced, and the power amplifying stage of the power amplifier only needs a chip area that is half of that of the power amplifying stage in the 2G network mode, or even smaller.

In order to provide a more detailed understanding of the features and technical aspects of the disclosure, the implementation of the disclosure will be described in detail below with reference to the accompanying drawings.

Figure 2:
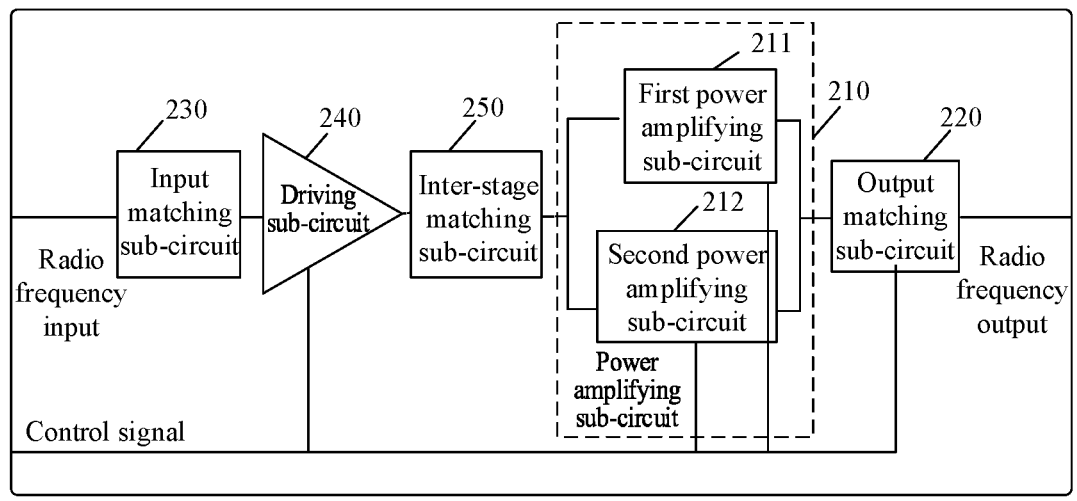
FIG. 2 is a schematic diagram of a basic composition structure of a circuit for radio frequency power amplifying according to an embodiment of the disclosure.

In the embodiment of the disclosure, a basic composition structure of the circuit for radio frequency power amplifying is illustrated in FIG. 2. The circuit for radio frequency power amplifying includes a power amplifying sub-circuit 210 and an output matching sub-circuit 220.

The power amplifying sub-circuit 210 is configured to select, according to a received control signal corresponding to a radio frequency mode, a power amplifying parameter corresponding to the radio frequency mode, amplify a received radio frequency signal, and output the amplified radio frequency signal at an output.

The output matching sub-circuit 220 is connected to the power amplifying sub-circuit 210 and configured to receive the amplified radio frequency signal and transmit the amplified radio frequency signal by using impedance corresponding to the radio frequency mode according to the control signal.

The radio frequency mode is a manner in which the circuit for radio frequency power amplifying amplifies the radio frequency signal in different network modes. The network mode may be a 2G network mode, a 3G/4G network mode, or other communication network mode.

In the present embodiment, the circuit for radio frequency power amplifying may be used for amplifying radio frequency signals of at least two radio frequency modes.

The control signal is a signal having an indication capability and corresponding to the radio frequency mode, such as a digital logic signal supporting a general purpose input output (GPIO) interface and a mobile industry processor interface (MIPI). Relative to a reference level, the logic high may be set to a level value of 5 V, 1.2 V, 3.3 V, etc. The logic low may be a reference level, or a level value lower than the reference level. The reference level may be 0 V, or −1.2 V, etc. The specific values of the logic high and the logic low may be set according to actual circuit requirements. The control signal may also provide a bias current and a bias voltage for the power amplifying sub-circuit.

Optionally, the power amplifying sub-circuit 210 may include a first power amplifying sub-circuit 211.

The power amplifying sub-circuit 210 is configured to select, when the radio frequency mode is a first radio frequency mode, the first power amplifying sub-circuit and amplify the radio frequency signal. The first power amplifying sub-circuit having a power amplifying parameter corresponding to the first radio frequency mode.

The output matching sub-circuit 220 is configured to receive, when the radio frequency mode is a first radio frequency mode, the radio frequency signal amplified by the first power amplifying sub-circuit, and transmit the amplified radio frequency signal by using impedance corresponding to the first radio frequency mode according to the control signal.

Optionally, the power amplifying sub-circuit 210 may further include a second power amplifying sub-circuit 212.

The power amplifying sub-circuit 210 is further configured to select, when the radio frequency mode is a second radio frequency mode, the first power amplifying sub-circuit 211 and the second power amplifying sub-circuit 212 and jointly amplify the radio frequency signal. A circuit jointly formed by the first power amplifying sub-circuit and the second power amplifying sub-circuit has a power amplifying parameter corresponding to the second radio frequency mode.

The output matching sub-circuit 220 is further configured to receive, when the radio frequency mode is a second radio frequency mode, the radio frequency signal jointly amplified by the first power amplifying sub-circuit and the second power amplifying sub-circuit, and transmit the amplified radio frequency signal by using impedance corresponding to the second radio frequency mode according to the control signal.

The power amplifying parameter may include various circuit parameters affecting the amplification of radio frequency signals. The circuit parameters may include a capacitance value of the circuit, a resistance value, an inductance value, an amplification factor of a radio frequency signal, a transmission path or passing components of a radio frequency signal in the power amplifying sub-circuit 210, or on or off parameters of one or more switching elements in the power amplifying sub-circuit 210, or various parameters affecting the amplification of the radio frequency signal. The power amplifying parameter may be a configuration parameter corresponding to the radio frequency mode and required by the circuit when the radio frequency signal is amplified.

In the present embodiment, different radio frequency modes require different power amplifying parameters, and radio frequency signals corresponding to the radio frequency modes are amplified. Therefore, in the present embodiment, the power amplifying parameter corresponding to the radio frequency mode is selected for adaptive amplification of radio frequency signals. After amplifying the radio frequency signal, it is also necessary to select impedance corresponding to the radio frequency mode to transmit the amplified radio frequency signal. Here, the circuit jointly formed by the first power amplifying sub-circuit 211 and the second power amplifying sub-circuit 212 has a circuit parameter different from that of the separate first power amplifying sub-circuit 211. The output matching sub-circuit 220 also uses different circuit parameters in different radio frequency modes. The difference in the circuit parameters is reflected in the difference in a circuit structure and/or a circuit property. The difference in the circuit structure includes difference in used components, and difference in connection relationships between the components. The difference in circuit property may include difference in impedance presented by the overall and/or partial circuits. The difference in the circuit parameter corresponds to the power amplifying parameter.

In the embodiment of the disclosure, the radio frequency modes corresponding to the 3G network mode and the 4G network mode are the same, and the radio frequency modes corresponding to the 2G network mode and the 3G/4G network mode are different.

In some embodiments, when the radio frequency mode corresponding to the 3G network mode and the 4G network mode is the first radio frequency mode, the radio frequency mode corresponding to the 2G network mode is the second radio frequency mode. In this way, the first power amplifying sub-circuit 211 is configured to amplify a radio frequency signal of the radio frequency mode corresponding to the 3G network mode and the 4G network mode. The first power amplifying sub-circuit 211 and the second power amplifying sub-circuit 212 are configured to amplify A radio frequency signal of the radio frequency mode corresponding to the 2G network mode.

In the present embodiment, the radio frequency mode is not limited to the radio frequency mode corresponding to the 2G, 3G, or 4G network mode.

Optionally, a first logical combination of the control signals may correspond to the first radio frequency mode, and a second logical combination of the control signals may correspond to the second radio frequency mode. The power amplifying sub-circuit 210 receives the control signal and the radio frequency signal, and enters a radio frequency mode corresponding to the control signal according to the control signal.

That is, in the embodiment of the disclosure, the control signal has two mapping relationships with the radio frequency mode. For example, when the control signal is a first control signal, the control signal corresponds to the first radio frequency mode; and when the control signal is a second control signal, the control signal corresponds to the second radio frequency mode.

Due to its own mobility, a mobile device automatically switches the selected network mode according to the network coverage of a current location of the mobile terminal. A processor of the mobile terminal may generate, according to a current network mode of the mobile terminal, a control signal corresponding to the network mode, for example, generate a first control signal or a second control signal, and transmit the generated control signal to the power amplifying sub-circuit.

When the control signal is the first logical combination, the power amplifying sub-circuit 210 enters the first radio frequency mode, the power amplifying sub-circuit 210 selects a power amplifying parameter corresponding to the first radio frequency mode. The first power amplifying sub-circuit 211 amplifies the radio frequency signal, and the first power amplifying sub-circuit 211 has the power amplifying parameter corresponding to the first radio frequency mode. The output matching sub-circuit 220 receives the radio frequency signal amplified and outputted by the first power amplifying sub-circuit 211, provides impedance matching the power amplifying parameter corresponding to the first radio frequency mode according to the control signal of the first logical combination, and transmits the amplified radio frequency signal.

When the control signal is the second logical combination, the power amplifying sub-circuit 210 enters the second radio frequency mode, and selects a power amplifying parameter corresponding to the second radio frequency mode. The first power amplifying sub-circuit 211 and the second power amplifying sub-circuit 212 jointly amplify the radio frequency signal, and a circuit jointly formed by the first power amplifying sub-circuit 211 and the second power amplifying sub-circuit 212 has the power amplifying parameter corresponding to the second radio frequency mode. The output matching sub-circuit 220 receives the amplified radio frequency signal jointly outputted by the first power amplifying sub-circuit 211 and the second power amplifying sub-circuit 212, provides impedance matching the power amplifying parameter corresponding to the second radio frequency mode according to the control signal of the second logical combination, and transmits the amplified radio frequency signal.

The power amplifying sub-circuit 210 may change a connection relationship of the power amplifying sub-circuit, the number of connected electronic components (e.g., capacitors, inductors, and/or resistors), impedance and other parameters by changing a switching state of a controlled switch in the circuit, so as to adjust the power amplifying parameter. Changing the connection relationship may include changing the electronic components connected in series to the electronic components connected in parallel. There are various specific implementations, which are not exemplified herein.

Optionally, when the control signal is the first logical combination, the control signal may correspond to the second radio frequency mode of the power amplifying sub-circuit 210; and when the control signal is the second logical combination, the control signal may correspond to the first radio frequency mode of the power amplifying sub-circuit 210.

Optionally, the circuit for radio frequency power amplifying further includes an input matching sub-circuit 230, a driving sub-circuit 240 and an inter-stage matching sub-circuit 250.

The input matching sub-circuit 230 is configured to receive a radio frequency signal, provide matching impedance for internal resistance of the radio frequency signal, and output the radio frequency signal.

The driving sub-circuit 240 is connected to the input matching sub-circuit 230, and configured to receive the radio frequency signal outputted by the input matching sub-circuit 230, amplify the radio frequency signal, and output the radio frequency signal.

The inter-stage matching sub-circuit 250 is connected to the driving sub-circuit 240, and configured to receive the radio frequency signal outputted by the driving sub-circuit 240, provide impedance matching the internal resistance of the radio frequency signal, and transmit the radio frequency signal to the power amplifying sub-circuit 210.

The functions of the input matching sub-circuit 230, the driving sub-circuit 240 and the inter-stage matching sub-circuit 250 are processing the received radio frequency signal, and providing the power amplifying sub-circuit 210 with a radio frequency signal adapted to the power amplifying parameter of the power amplifying sub-circuit, such that the power amplifying sub-circuit 210 can amplify the radio frequency signal, and the distortion of the amplified radio frequency signal can be reduced.

Figure 3:
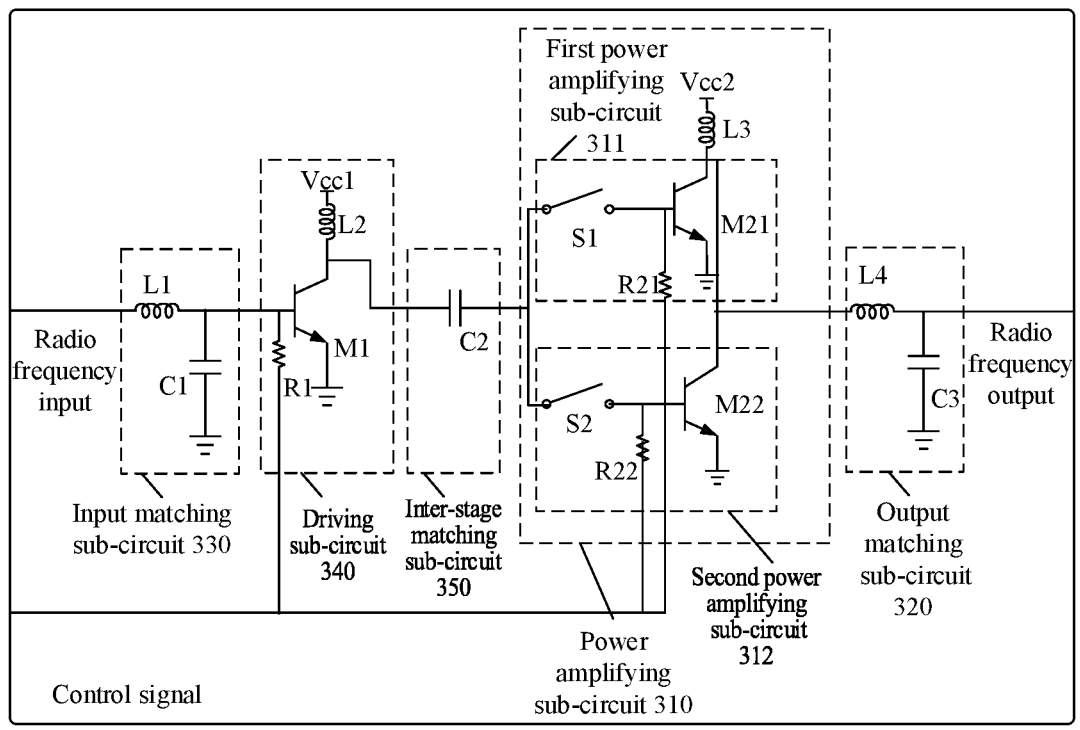
FIG. 3 is a schematic diagram of a specific composition structure of a circuit for radio frequency power amplifying according to an embodiment of the disclosure.

In the embodiment of the disclosure, a specific composition structure of the circuit for radio frequency power amplifying is illustrated in FIG. 3. The circuit for radio frequency power amplifying includes a power amplifying sub-circuit 310 and an output matching sub-circuit 320.

The power amplifying sub-circuit 310 includes an input matching sub-circuit 330, a driving sub-circuit 340, an inter-stage matching sub-circuit 350, a power amplifying sub-circuit 310 and an output matching sub-circuit 320.

The input matching sub-circuit 330 includes a first inductor and a first capacitor. The first inductor may be expressed as L1, and the first capacitor may be expressed as C1.

One end of the first inductor L1 receives a radio frequency signal, the other end of the first inductor L1 is connected to the driving sub-circuit 340, the other end of the first inductor L1 is further connected to one end of the first capacitor C1, and the other end of the first inductor L1 is grounded.

Optionally, the first capacitor C1 and the first inductor L1 may form input impedance, a received radio frequency signal may be provided with impedance matching the internal resistance of the received radio frequency signal, and a radio frequency input signal may be provided for the driving sub-circuit 340.

The driving sub-circuit 340 includes a first transistor, which may be expressed as M1.

The transistor in the embodiment of the disclosure may be a metal-oxide-semiconductor (MOS) field effect transistor, a heterojunction bipolar transistor (HBT), or a bipolar junction transistor (BJT) and other circuit components with a function of power amplifying. In the embodiment of the disclosure, a BJT is taken as an example, and the BJT may be referred to as a triode.

The first transistor M1 has a first end, a second end and a third end. When the first transistor M1 is a triode, the first end of the first transistor M1 is a base, the second end of the first transistor M1 is a collector, and the third end of the first transistor M1 is an emitter.

The first end of the first transistor M1 receives a radio frequency signal transmitted by the input matching sub-circuit 330. The second end of the first transistor is connected to a second inductor. The third end of the first transistor M1 is grounded.

The driving sub-circuit 340 further includes a second inductor and a first resistor.

The second inductor may be expressed as L2, and the first resistor may be expressed as R1.

One end of the second inductor L2 is connected to a first power supply, and the other end of the first inductor L1 is connected to the collector of the first transistor M1. One end of the first resistor R1 is inputted with a control signal, and the other end of the first resistor R1 is connected to the first end of the first transistor M1. The control signal provides a bias signal for the first transistor through the first resistor R1. The first power supply may be expressed as Vcc1.

The driving sub-circuit 340 is configured to receive a radio frequency signal at a first end, amplify the received radio frequency signal, and output the amplified radio frequency signal at a second end.

The inter-stage matching sub-circuit 350 includes a second capacitor. The second capacitor may be expressed as C2. The second capacitor C2 receives the radio frequency signal outputted by the driving sub-circuit 340, provides impedance matching the internal resistance of the radio frequency signal to the radio frequency signal, and transmits the radio frequency signal to the power amplifying sub-circuit 310.

The power amplifying sub-circuit 310 includes a first power amplifying sub-circuit 311, a second power amplifying sub-circuit 312 and a third inductor. The first power amplifying sub-circuit 311 and the second power amplifying sub-circuit 312 are connected in parallel. The third inductor may be expressed as L3.

The first power amplifying sub-circuit 311 includes a first switch, a second transistor and a second resistor. The first switch may be expressed as S1, the second transistor may be expressed as M21, and the second resistor may be expressed as R21.

The first switch S1 may be a circuit component having a switching function such as a MOS transistor or a triode. The first switch S1 receives the radio frequency signal, and transmits the radio frequency signal to the second transistor M21 when the first switch S1 is closed.

The second transistor M21 has a first end, a second end and a third end. The first end of the second transistor M21 receives the radio frequency signal transmitted by the first switch, the second end of the second transistor M21 is connected to the third inductor L3, and the third end of the second transistor is grounded.

One end of the second resistor R21 receives the control signal, and the other end of the second resistor R21 is connected to the first end of the second transistor.

The second power amplifying sub-circuit 312 has a second switch, a third transistor and a third resistor. The second switch may be expressed as S2, the third transistor may be expressed as M22, and the third resistor may be expressed as R22.

The second switch S2 may be a circuit component having a switching function such as a MOS transistor or a triode. The second switch S2 receives the radio frequency signal, and transmits the radio frequency signal to the third transistor M22 when the second switch S2 is closed.

The third transistor M22 has a first end, a second end and a third end. The first end of the third transistor M22 receives the radio frequency signal transmitted by the second switch S2, the second end of the third transistor M22 is connected to the third inductor L3, and the third end of the third transistor M22 is grounded.

One end of the third resistor R22 receives the control signal, and the other end of the third resistor R22 is connected to the first end of the third transistor M22.

One end of the third inductor L3 is connected to the second transistor and the third transistor separately, and the other end of the third transistor is connected to a second power supply. The third inductor L3 may filter out an interference signal in the circuit. The second power supply may be expressed as Vcc2.

Optionally, the first power amplifying sub-circuit 311 and the second power amplifying sub-circuit 312 receive a control signal. In the first radio frequency mode, the first switch S1 is closed, the second switch S2 is open, the radio frequency signal is amplified by the first power amplifying sub-circuit 311, and the amplified radio frequency signal is outputted at the second end of the second transistor M21. In the second radio frequency mode, both the first switch S1 and the second switch S2 are closed, and the radio frequency signal is jointly amplified by the first power amplifying sub-circuit 311 and the second power amplifying sub-circuit 312. The second end of the second transistor M21 is connected to the second end of the third transistor to jointly output the amplified radio frequency signal. The control signal may also provide a bias signal for the second transistor and the third transistor.

The output matching sub-circuit 320 includes a fourth inductor and a third capacitor. The fourth inductor may be expressed as L4, and the third capacitor may be expressed as C3.

One end of the fourth inductor L4 is connected to the output end of the power amplifying sub-circuit 310. Optionally, one end of the fourth inductor L4 is connected to the second end of the second transistor M21 and the second end of the third transistor M22. The other end of the fourth inductor L4 is connected to the third capacitor C3, and the amplified radio frequency signal is outputted.

One end of the third capacitor C3 is connected to the other end of the fourth inductor L4, and the other end of the third capacitor C3 is grounded.

The fourth inductor L4 is a variable inductor, and the third capacitor C3 is a variable capacitor. The fourth inductor L4 and the third capacitor C3 provide impedance matching the radio frequency mode according to the radio frequency mode.

In some embodiments, the first switch in the power amplifying sub-circuit 310 may be outside the first power amplifying sub-circuit 311, and the first switch connects the inter-stage matching sub-circuit 350 and the first power amplifying sub-circuit 311. The second switch may be outside the second power amplifying sub-circuit 312, and the second switch connects the inter-stage matching sub-circuit 350 and the second power amplifying sub-circuit 312.

Figure 4:
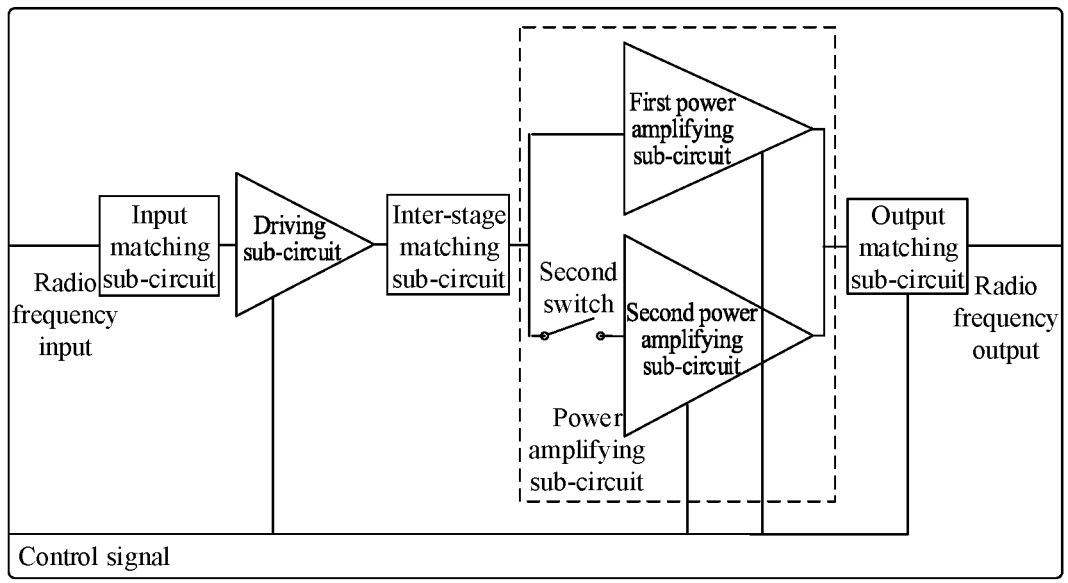
FIG. 4 is a schematic diagram of a basic structure of another circuit for radio frequency power amplifying according to an embodiment of the disclosure.

In some cases, the first switch may also be omitted, and a basic structure of the circuit for radio frequency power amplifying omitting the first switch is illustrated in FIG. 4. In this case, the first power amplifying sub-circuit is in an on state. The power amplifying sub-circuit provides a circuit structure matching the radio frequency mode by opening or closing the second switch.

Optionally, the embodiment of the disclosure also provides a circuit structure of another output matching sub-circuit. A specific circuit structure of the output matching sub-circuit is illustrated in FIG. 5, and the circuit structure in FIG. 5 may be a low-pass circuit structure.

The output matching sub-circuit includes a matching network.

The matching network is connected to an output of the power amplifying sub-circuit, and includes i sub-networks. An $i^{th}$ sub-network has i inductors and i capacitors. One end of an $i^{th}$ inductor is connected to one end of an $i^{th}$ capacitor, and the other end of the $i^{th}$ inductor is connected to an $i-1^{th}$ capacitor. The other end of the $i^{th}$ capacitor is grounded. The $i-1^{th}$ inductor is an inductor shared by the $i^{th}$ sub-network and the $i-1^{th}$ sub-network, where i is a positive integer.

Figure 5:
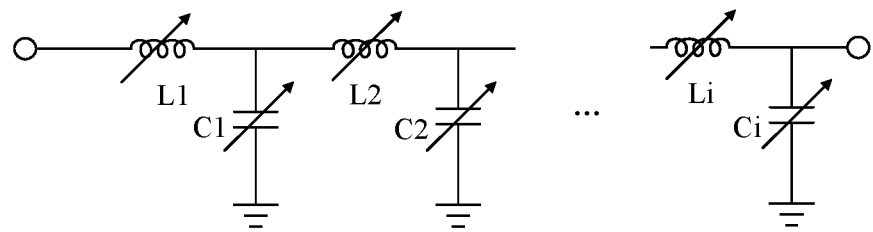
FIG. 5 is a schematic diagram of a specific composition structure of another output matching sub-circuit according to an embodiment of the disclosure.

As illustrated in FIG. 5, the matching network includes I inductors and I capacitors. The I inductors are in turn connected in series, one capacitor is connected between two adjacent inductors, and the other end of each capacitor is grounded. In the present embodiment, the last inductor included in the $i^{th}$ sub-network is an $i^{th}$ inductor, and i–1 inductors are connected in series in front of the $i^{th}$ inductor, that is, the $i^{th}$ inductor and the $i^{th}-1^{th}$ inductor are connected. The other end of the $i^{th}$ inductor is connected to a grounded capacitor. A capacitor of the $i^{th}$ sub-network is the $i^{th}$ capacitor.

The inductor may be a variable inductor, and the capacitor may be a variable capacitor.

The variable inductor includes j parallel branches. Each branch includes one switch and one inductor, where j is a positive integer.

The variable capacitor includes k parallel branches. Each branch includes one switch and one capacitor, where k is a positive integer.

The i inductors in the $i^{th}$ sub-network may be expressed as L1, L2, . . . , Li. The $i^{th}$ capacitor $i^{th}$ sub-network may be expressed as Ci.

Optionally, the output matching sub-circuit receives the amplified radio frequency signal, and provides impedance matching the radio frequency mode according to the radio frequency mode. The impedance jointly formed by i variable inductors and i variable capacitors in the sub-network provides impedance matching the radio frequency mode, and a radio frequency signal is outputted at the output end of the output matching sub-circuit.

A circuit structure of the output matching sub-circuit may also be a low-pass circuit structure, a high-pass circuit structure, a band-pass circuit structure, or other circuit structures in different forms, as long as the impedance matching the radio frequency mode can be provided.

The low-pass circuit is a circuit where a low-frequency signal lower than a preset critical value normally passes and a high-frequency signal exceeding a set critical value is blocked or weakened. The circuit structure of the low-pass circuit is illustrated in FIG. 5, and a frequency of the signal passed by the low-pass circuit may be adjusted according to a parameter of a circuit component in the low-pass circuit.

Figure 9:
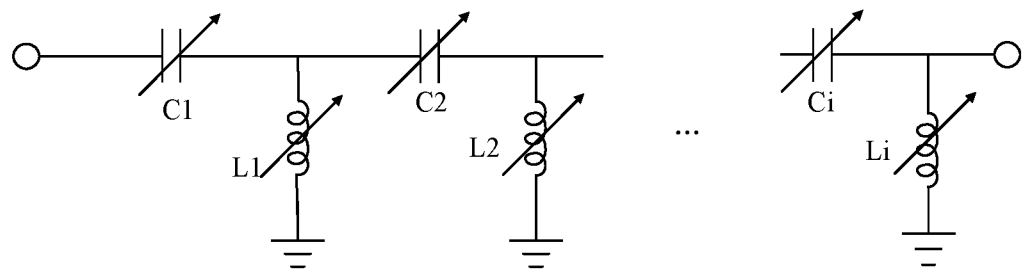
FIG. 9 is a schematic diagram of a basic structure of a high-pass circuit according to an embodiment of the disclosure.

The high-pass circuit may be a circuit where a high-frequency signal exceeding a preset critical value normally passes and a low-frequency signal lower than a set critical value is blocked or weakened. The circuit structure of the high-pass circuit is illustrated in FIG. 9. A frequency of the signal passed by the high-pass circuit may be adjusted according to a parameter of a circuit component in the high-pass circuit.

Figure 10:
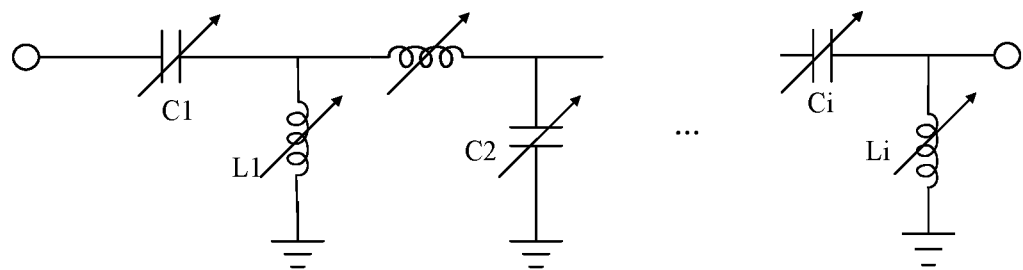
FIG. 10 is a first schematic diagram of basic structures of band-pass circuits according to some embodiments of the disclosure.
Figure 11:
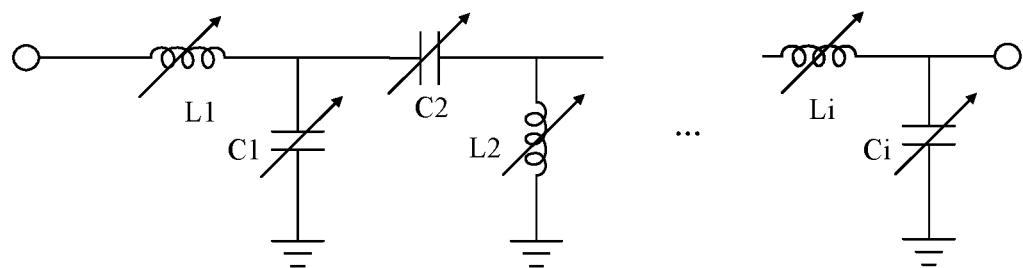
FIG. 11 is a second schematic diagram of basic structures of band-pass circuits according to some embodiments of the disclosure.

The band-pass circuit may be a circuit where a signal can pass a frequency within a certain frequency range and signals of frequencies within other ranges are blocked or weakened to a very low level. The circuit structures of the band-pass circuit may be illustrated in FIG. 10 and FIG. 11, and a frequency of the signal passed by the band-pass circuit may be adjusted according to a parameter of a circuit component in the band-pass circuit.

In the present embodiment, the low-frequency signal and the high-frequency signal are electrical signals, for example, current signals. For example, when a frequency of a direction change of the current is higher than a preset critical value, it is regarded as the high-frequency signal, and otherwise, it is regarded as the low-frequency signal.

The band-pass circuit allows a band-pass signal to pass, and the band-pass signal may be a signal with a frequency within a preset certain frequency range.

Figure 6:
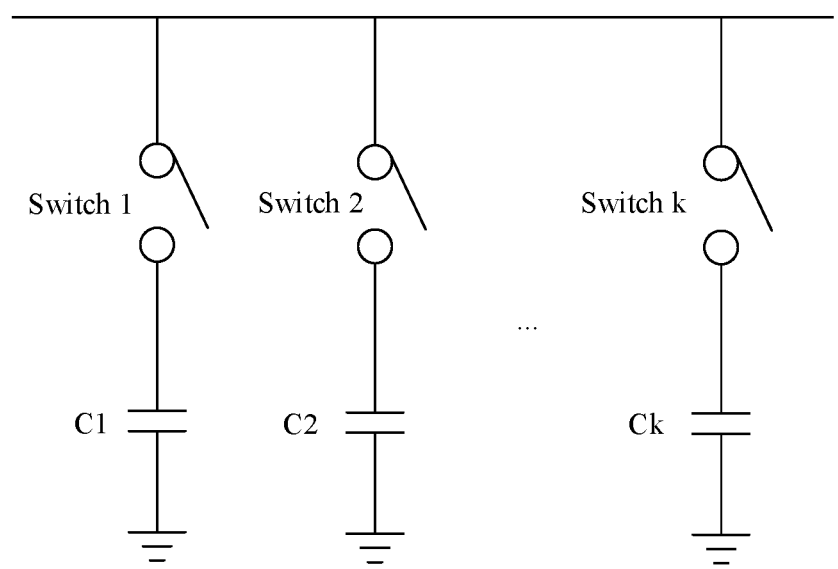
FIG. 6 is a schematic diagram of a specific composition structure of a variable capacitor according to an embodiment of the disclosure.

Optionally, the embodiment of the disclosure may also provide an implementation of another variable capacitor. A specific circuit structure of the variable capacitor is illustrated in FIG. 6.

The variable capacitor includes k parallel branches. Each branch includes one switch and one capacitor, where k is a positive integer.

The switch in a kth branch may be expressed as switch k, and a capacitor in the $k^{th}$ branch may be expressed as Ck.

The switch in each branch may also be an electronic component having a switching function such as a MOS transistor or a triode.

In the embodiment of the disclosure, the variable inductor may be formed by an array of switches and inductors.

Optionally, the output matching sub-circuit receives the amplified radio frequency signal, and selects to partially open or close the switches on the branches according to the radio frequency mode. The capacitor or inductor on the branches where the switch is closed provides impedance matching the radio frequency mode, and a radio frequency signal is outputted at an output of the output matching sub-circuit.

Figure 7:
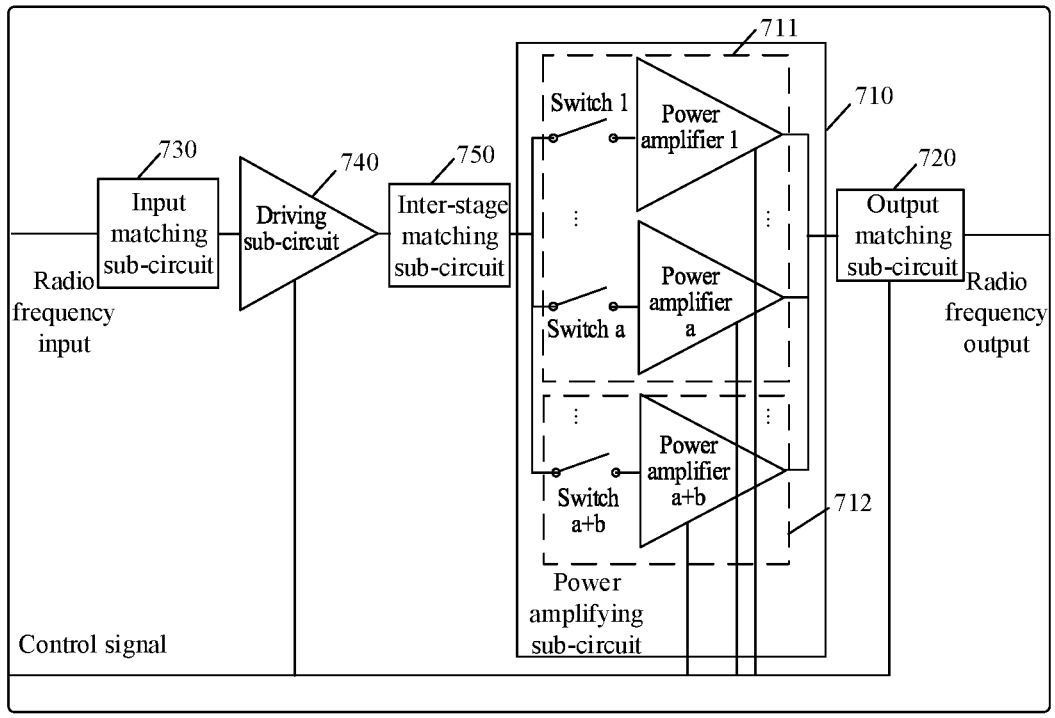
FIG. 7 is a schematic diagram of a basic structure of another circuit for radio frequency power amplifying according to an embodiment of the disclosure.

The embodiment of the disclosure also provides a circuit for radio frequency power amplifying in another structure. A basic circuit structure of the circuit for radio frequency power amplifying is illustrated in FIG. 7.

The circuit for radio frequency power amplifying includes a power amplifying sub-circuit 710, an output matching sub-circuit 720, an input matching sub-circuit 730, a driving sub-circuit 740 and an inter-stage matching sub-circuit 750.

The power amplifying sub-circuit 710 includes a first power amplifying sub-circuit 711 and a second power amplifying sub-circuit 712, which are connected in parallel.

The first power amplifying sub-circuit 711 includes a number of a parallel power amplifiers. The second power amplifying sub-circuit 712 includes a number of b parallel power amplifiers. a and b are integers greater than 1. The number of a parallel power amplifiers may be expressed as power amplifier 1, power amplifier 2, . . . , power amplifier a. The number of b parallel power amplifiers may be expressed as a power amplifier a+1, a power amplifier a+2, a power amplifier a+b.

The first power amplifying sub-circuit 711 further includes a plurality of switches, with a total number of a. Each switch is connected to each power amplifier in the first power amplifying sub-circuit. The switches may be expressed as switch 1, switch 2, . . . , switch a.

The second power amplifying sub-circuit 712 further includes a number of b switches. Each switch is connected to each power amplifier in the second power amplifying sub-circuit 712. The number of b switches may be expressed as switch a+1, switch a+2, . . . , switch a+b.

Optionally, the switch a is connected in series with the power amplifier a, and the switch a+b is connected in series with the power amplifier a+b. The first power amplifying sub-circuit 711 may provide a power amplifying parameter corresponding to the radio frequency mode by opening or closing one or more of the number of a switches, and the received radio frequency signal is amplified by one or more power amplifiers.

The second power amplifying sub-circuit 712 may provide a power amplifying parameter corresponding to the radio frequency mode by opening or closing part or all of the b switches, and the received radio frequency signal is amplified by part of all of the power amplifiers, or the radio frequency signal is not amplified.

There may be multiple radio frequency modes, which are not limited to the first radio frequency mode and the second radio frequency mode.

The output matching sub-circuit 720 receives the radio frequency signal outputted by the radio frequency power amplifying sub-circuit, provides impedance matching the radio frequency mode, and outputs the radio frequency signal at an output of the output matching sub-circuit 720.

The input matching sub-circuit 730 is configured to receive a radio frequency signal, provide matching impedance for internal resistance of the radio frequency signal, and output the radio frequency signal.

The driving sub-circuit 740 is connected to the input matching sub-circuit 730, and configured to receive the radio frequency signal outputted by the input matching sub-circuit 730, amplify the radio frequency signal, and output the radio frequency signal.

The inter-stage matching sub-circuit 750 is connected to the driving sub-circuit 740, and configured to receive the radio frequency signal outputted by the driving sub-circuit 740, provide impedance matching the internal resistance of the radio frequency signal, and transmit the radio frequency signal to the power amplifying sub-circuit 710.

In some embodiments, in order to simplify the solution, the first power amplifying sub-circuit and the second power amplifying sub-circuit in the power amplifying sub-circuit may be considered as a whole. In this time, the power amplifying sub-circuit in the circuit for radio frequency power amplifying has n power amplifiers, and the output matching sub-circuit has m matching networks.

The power amplifying sub-circuit has n parallel power amplifiers and n switches.

The output matching sub-circuit has m matching networks. Each matching network is connected to an output of at least one power amplifier in the power amplifying sub-circuit. n and m are integers greater than 1, and m is less than or equal to n.

Figure 8:
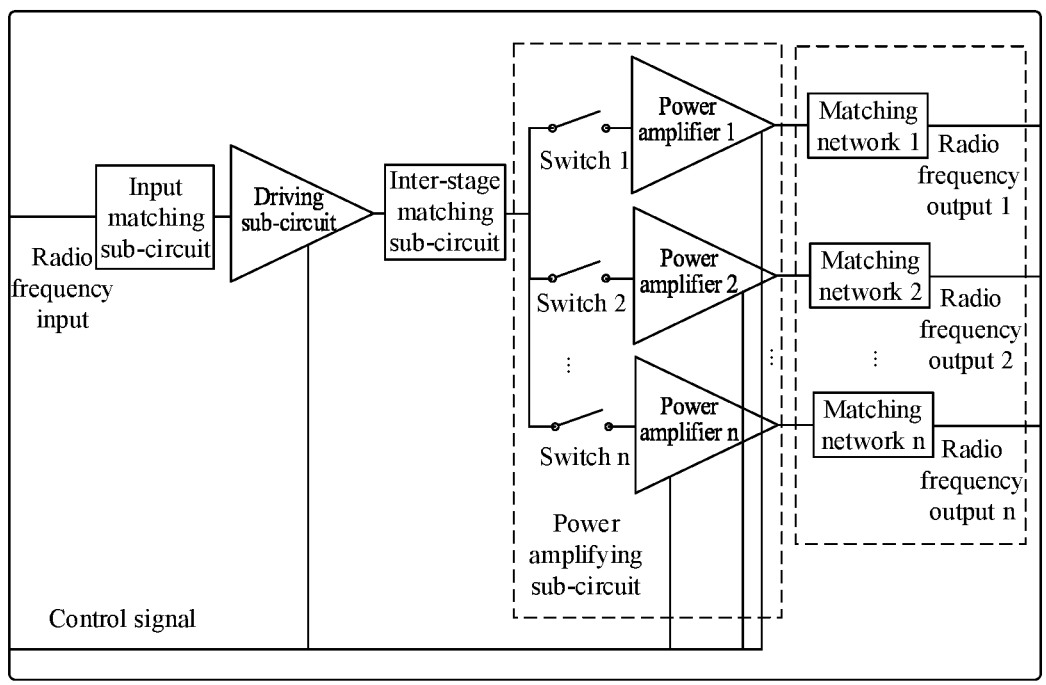
FIG. 8 is a schematic diagram of a basic structure of another power amplifying sub-circuit according to an embodiment of the disclosure.

FIG. 8 illustrates a circuit structure in which the power amplifying sub-circuit has n parallel power amplifiers and the output matching sub-circuit has n matching networks in the above solution.

The n parallel amplifiers may be expressed as power amplifier 1, power amplifier 2, . . . , power amplifier n. The n switches may be expressed as switch 1, switch 2, . . . , switch n. The n matching networks may be expressed as matching network 1, matching network 2, . . . , matching network n. n is an integer greater than 1.

Optionally, the matching network n is connected to the power amplifier n, provides suitable impedance for an output signal of the power amplifier n, and outputs a radio frequency output n.

In the embodiment of the disclosure, specific structures of the power amplifying sub-circuit and the output matching sub-circuit may be implemented by any one of the circuit structures in the above-mentioned solution. The power amplifying sub-circuit and the output matching sub-circuit may be any combination of the circuit structures in the above-mentioned solution.

The embodiment of the disclosure also provides a method for adjusting a radio frequency mode, which may be applied to a communication device including the circuit for radio frequency power amplifying in any one of the foregoing technical solutions, where the communication device may include a mobile device such as a mobile phone, a tablet computer, or a wearable device. The method may include the operations as follows.

A radio frequency mode currently used by a communication device is determined;

a control signal is generated according to correspondences between the radio frequency mode and the control signal;

the control signal is inputted into a power amplifying sub-circuit and an output matching sub-circuit in an electronic device;

the power amplifying sub-circuit selects a power amplifying parameter according to the control signal and amplify a received radio frequency signal; and the output matching sub-circuit transmits the amplified radio frequency signal by using impedance corresponding to the radio frequency mode according to the control signal.

In the present embodiment, the power amplifying parameter of the power amplifying circuit may be adjusted according to requirements, and the output matching sub-circuit may adjust its own impedance according to a control mode to match amplifying sub-circuits of different power amplifying parameters to ensure a power forwarding efficiency and the like of the radio frequency signal.

Optionally, the power amplifying sub-circuit may select a first power amplifying sub-circuit and amplify the radio frequency signal when the radio frequency mode is a first radio frequency mode. The first power amplifying sub-circuit has a power amplifying parameter corresponding to the first radio frequency mode.

The operation that the output matching sub-circuit transmits the amplified radio frequency signal by using the impedance corresponding to the radio frequency mode according to the control signal includes the following actions.

The output matching sub-circuit receives the radio frequency signal amplified by the first power amplifying sub-circuit, and transmits the amplified radio frequency signal by using impedance corresponding to the first radio frequency mode according to the control signal.

Optionally, the operations that the power amplifying sub-circuit selects the power amplifying parameter according to the control signal and amplifies a received radio frequency signal may further include the following actions.

When the radio frequency mode is a second radio frequency mode, the first power amplifying sub-circuit and a second power amplifying sub-circuit are selected to jointly amplify the radio frequency signal. A circuit jointly formed by the first power amplifying sub-circuit and the second power amplifying sub-circuit has a power amplifying parameter corresponding to the second radio frequency mode.

The operation that the output matching sub-circuit transmits the amplified radio frequency signal by using the impedance corresponding to the radio frequency mode according to the control signal includes the following actions.

The output matching sub-circuit receives the radio frequency signal jointly amplified by the first power amplifying sub-circuit and the second power amplifying sub-circuit, and transmits the amplified radio frequency signal by using impedance corresponding to the second radio frequency mode according to the control signal.

The above is only the preferred embodiment of the disclosure and is not intended to limit the scope of protection of the disclosure.

In the embodiment of the disclosure, a circuit for radio frequency power amplifying is provided, in which a power amplifying parameter and impedance matching are switched according to a radio frequency mode. In this case, different radio frequency modes may share one power amplifying circuit, so that no dedicated circuit for radio frequency power amplifying is provided for each radio frequency mode. On the one hand, the circuit for radio frequency amplifying is shared, and an effective utilization rate of the circuit for radio frequency power amplifying is improved. On the other hand, the number of radio frequency amplifying circuits in a device is reduced, a structure of an electronic device can be simplified, and the electronic device can be light and thin, so that it has a positive industrial effect. In the present embodiment, the power amplifying parameter of the circuit for radio frequency power amplifying can be adjusted by a circuit specific design and generation of a control signal, thereby having the characteristics of simple implementation and wide application in the industry.

The invention claimed is:

1. A circuit for radio frequency power amplifying, comprising: a power amplifying sub-circuit and an output matching sub-circuit, wherein
   the power amplifying sub-circuit is configured to select, according to a received control signal corresponding to a radio frequency mode, a power amplifying parameter corresponding to the radio frequency mode, amplify a received radio frequency signal, and output the amplified radio frequency signal; and
   the output matching sub-circuit is connected to the power amplifying sub-circuit, and configured to receive the amplified radio frequency signal and transmit the amplified radio frequency signal by using impedance corresponding to the radio frequency mode according to the control signal;
   wherein the power amplifying sub-circuit comprises a first power amplifying sub-circuit;
   the power amplifying sub-circuit is configured to select, when the radio frequency mode is a first radio frequency mode, the first power amplifying sub-circuit and amplify the radio frequency signal, wherein the first power amplifying sub-circuit has a power amplifying parameter corresponding to the first radio frequency mode; and
   the output matching sub-circuit is configured to receive the radio frequency signal amplified by the first power amplifying sub-circuit, and transmit the amplified radio frequency signal by using impedance corresponding to the first radio frequency mode according to the control signal; and
   wherein the power amplifying sub-circuit further comprises a second power amplifying sub-circuit, connected in parallel with the first power amplifying sub-circuit;
   the power amplifying sub-circuit is further configured to select, when the radio frequency mode is a second radio frequency mode, the first power amplifying sub-circuit and the second power amplifying sub-circuit and jointly amplify the radio frequency signal, wherein a circuit jointly formed by the first power amplifying sub-circuit and the second power amplifying sub-circuit has a power amplifying parameter corresponding to the second radio frequency mode; and
   the output matching sub-circuit is further configured to receive the radio frequency signal jointly amplified by the first power amplifying sub-circuit and the second power amplifying sub-circuit, and transmit the amplified radio frequency signal by using impedance corresponding to the second radio frequency mode according to the control signal.

2. The circuit according to claim 1, wherein
the first power amplifying sub-circuit comprises a number of a parallel power amplifiers; and
the second power amplifying sub-circuit comprises a number of b parallel power amplifiers,
where a and b are integers greater than 1.

3. The circuit according to claim 2, wherein
the first power amplifying sub-circuit further comprises a number of a switches, wherein each switch is connected to each power amplifier in the first power amplifying sub-circuit; and
the second power amplifying sub-circuit further comprises a number of b switches, where each switch is connected to each power amplifier in the second power amplifying sub-circuit.

4. A terminal comprising the circuit according to claim 1, wherein the circuit for radio frequency power amplifying is configured to as common circuit to amplify radio frequency signals in different radio frequency modes in multiple communication modes, thereby reducing number of circuits for radio frequency power amplifying and area of a printed circuit board occupied by the circuit for radio frequency power amplifying, reducing a volume occupied by the printed circuit board in the terminal, and improving integration.

5. A circuit for radio frequency power amplifying, comprising: a power amplifying sub-circuit and an output matching sub-circuit, wherein
the power amplifying sub-circuit is configured to select, according to a received control signal corresponding to a radio frequency mode, a power amplifying parameter corresponding to the radio frequency mode, amplify a received radio frequency signal, and output the amplified radio frequency signal; and
the output matching sub-circuit is connected to the power amplifying sub-circuit, and configured to receive the amplified radio frequency signal and transmit the amplified radio frequency signal by using impedance corresponding to the radio frequency mode according to the control signal; and
wherein the output matching sub-circuit comprises a matching network;
the matching network is connected to an output of the power amplifying sub-circuit and comprises I sub-networks, wherein an $i^{th}$ sub-network has i inductors and i capacitors; one end of an $i^{th}$ inductor is connected to one end of an $i^{th}$ capacitor; the other end of the $i^{th}$ capacitor is grounded; the other end of the $i^{th}$ inductor is connected to an $i-1^{th}$ inductor; the $i-1^{th}$ inductor is an inductor shared by the $i^{th}$ sub-network and an $i-1^{th}$ sub-network, where i is a positive integer not greater than I and not less than 1, and I is a positive integer.

6. The circuit according to claim 5, wherein
the inductor is a variable inductor; and
the capacitor is a variable capacitor.

7. The circuit according to claim 6, wherein
the variable inductor comprises j parallel branches, wherein each branch comprises one switch and one inductor, where j is a positive integer; and
the variable capacitor comprises k parallel branches, wherein each branch comprises one switch and one capacitor, where k is a positive integer.

8. The circuit according to claim 5, wherein
the power amplifying sub-circuit has n parallel power amplifiers; and
the output matching sub-circuit has m matching networks, wherein each matching network is connected to an output of at least one power amplifier in the power amplifying sub-circuit,
where n and m are integers greater than 1, and m is less than or equal to n.

9. The circuit according to claim 1, wherein the output matching sub-circuit comprises at least one of: a low-pass circuit structure, a high-pass circuit structure, and a band-pass circuit structure.

10. A method for adjusting a radio frequency mode, comprising:
determining a radio frequency mode currently used by a communication device;
generating a control signal according to correspondences between the radio frequency mode and the control signal;
inputting the control signal into a power amplifying sub-circuit and an output matching sub-circuit in an electronic device;
selecting, by the power amplifying sub-circuit, a power amplifying parameter according to the control signal and amplifying a received radio frequency signal; and
transmitting, by the output matching sub-circuit, the amplified radio frequency signal by using impedance corresponding to the radio frequency mode according to the control signal;
wherein
the selecting, by the power amplifying sub-circuit, the power amplifying parameter according to the control signal and amplifying the received radio frequency signal comprises:
selecting, by the power amplifying sub-circuit, a first power amplifying sub-circuit and amplifying the radio frequency signal when the radio frequency mode is a first radio frequency mode, wherein the first power amplifying sub-circuit has a power amplifying parameter corresponding to the first radio frequency mode;
the transmitting, by the output matching sub-circuit, the amplified radio frequency signal by using the impedance corresponding to the radio frequency mode according to the control signal comprises:
receiving, by the output matching sub-circuit, the radio frequency signal amplified by the first power amplifying sub-circuit, and transmitting the amplified radio frequency signal by using impedance corresponding to the first radio frequency mode according to the control signal;
the selecting, by the power amplifying sub-circuit, the power amplifying parameter according to the control signal and amplifying the received radio frequency signal further comprises:
selecting, when the radio frequency mode is a second radio frequency mode, the first power amplifying sub-circuit and a second power amplifying sub-circuit and jointly amplifying the radio frequency signal, wherein a circuit jointly formed by the first power amplifying sub-circuit and the second power amplifying sub-circuit has a power amplifying parameter corresponding to the second radio frequency mode;
the transmitting, by the output matching sub-circuit, the amplified radio frequency signal by using the impedance corresponding to the radio frequency mode according to the control signal comprises:

receiving, by the output matching sub-circuit, the radio frequency signal jointly amplified by the first power amplifying sub-circuit and the second power amplifying sub-circuit, and transmitting the amplified radio frequency signal by using impedance corresponding to the second radio frequency mode according to the control signal.

\* \* \* \* \*